United States Patent [19]

Walding, Jr. et al.

[11] Patent Number: 5,744,714
[45] Date of Patent: Apr. 28, 1998

[54] INSTRUMENT HOUSING WITH ELECTRICAL DISCHARGE GAP

[75] Inventors: H. Paul Walding, Jr., Slinger; Donald H. Strobel, Brookfield; Mark M. Lazar; Kenneth R. Bloss, Jr., both of New Berlin, all of Wis.

[73] Assignee: Badger Meter, Inc., Milwaukee, Wis.

[21] Appl. No.: 740,411

[22] Filed: Oct. 29, 1996

[51] Int. Cl.⁶ ................................................. G01D 11/24
[52] U.S. Cl. ........................................ 73/431; 73/866.3
[58] Field of Search .................... 73/431, 273, 866.3; 324/110

[56] References Cited

U.S. PATENT DOCUMENTS

| | | | |
|---|---|---|---|
| 2,620,412 | 12/1952 | Ford | 73/431 |
| 3,725,745 | 4/1973 | Zisa | 324/110 |
| 4,110,814 | 8/1978 | Britton et al. | 324/110 |
| 4,868,566 | 9/1989 | Strobel et al. | 340/870.3 |
| 5,365,785 | 11/1994 | Martin | 73/431 |

Primary Examiner—Hezron E. Williams
Assistant Examiner—Nashmiya Fayyaz
Attorney, Agent, or Firm—Quarles & Brady

[57] ABSTRACT

An assembly for electrostatic discharge has a chassis (14, 24) inside the instrument housing (11, 12) with a support for holding wires (21), a pair of insulated wires (21) having portions where the insulation (31) is partially removed and where the wires are mounted to the support (25), a base (12) of a conductive material having a projection (43) extending upward opposite the portions (42) where the insulation (31) has been removed, such that a gap (44) is provided through which charge may be conducted to the base (12) of conductive material for discharge from the interior space (41) of the instrument (10). The instrument (10) contains a volume of a gas for conducting electrostatic charge.

18 Claims, 2 Drawing Sheets

INSTRUMENT HOUSING WITH ELECTRICAL DISCHARGE GAP

TECHNICAL FIELD

The invention relates to instruments for measuring quantities such as electricity, gas and water consumption.

DESCRIPTION OF THE BACKGROUND ART

In the field of water meters, a turbine or other flow measuring device is connected in the water supply line. Water consumption units are counted and displayed by a register unit that is mounted on top of the flow measurement housing. The display may be a dial-type or an odometer-type or a combination of these. The register unit is operated by electromagnetic coupling, so that no wires are required to connect the flow measurement housing to the register unit.

Inside the register is a pulse transmitter as described in Strobel et al., U.S. Pat. No. 4,868,566, entitled "Flexible Piezoelectric Switch Activated Metering Pulse Generators." This pulse transmitter unit converts mechanical movements to electrical pulses. In certain units, the pulse must be transmitted via wires to certain remote transponder units for transmission to a reader unit. The need for the entry of wires presents a problem, in that electrostatic charges may be experienced either from events outside the meter register or inside the meter register.

There is a further problem in assembly and manufacture of the register unit in evacuating air and introducing a gas such as helium to maintain the crystal area of the register in a clear, readable state, similar to that of a wristwatch. The helium filled atmosphere is somewhat conductive of electric charge, and therefore some means of electrostatic discharge is desirable.

Certain methods using Kapton tape and shields were unsuccessful due to the conductivity of helium gas in the interior of the sealed register unit.

The general objective of the present invention is to provide electrostatic discharge for a sealed register unit particularly in a region where wires enter the unit.

SUMMARY OF THE INVENTION

The invention relates to an instrument housing having wires that enter the housing and a construction that provides for electrostatic discharge.

The instrument contains a volume of a gas for conducting electrostatic charge The instrument has a pair of insulated wires having portions where the insulation is partially removed and where the wires are mounted to a support on a chassis in the instrument housing. A base of the housing is formed of a conductive material and is formed with a projection extending upward towards the portions of the wires where the insulation has been removed, such that a gap is provided through which charge may be conducted to the base of conductive material for discharge from the interior of the instrument.

The invention provides advantages in the cost of manufacturing the meter register assembly.

The invention eliminates the need for a tape or separate shield.

The invention is applicable to many types of instrument enclosures, wherever a sealed wire entry is needed.

Other objects and advantages, besides those discussed above, will be apparent to those of ordinary skill in the art from the description of the preferred embodiment which follows. In the description, reference is made to the accompanying drawings, which form a part hereof, and which illustrate examples of the invention. Such examples, however, are not exhaustive of the various embodiments of the invention and, therefore, reference is made to the claims which follow the description for determining the scope of the invention.

DETAILED DESCRIPTION OF THE PREFERRED EMBODIMENT

Figure 1:
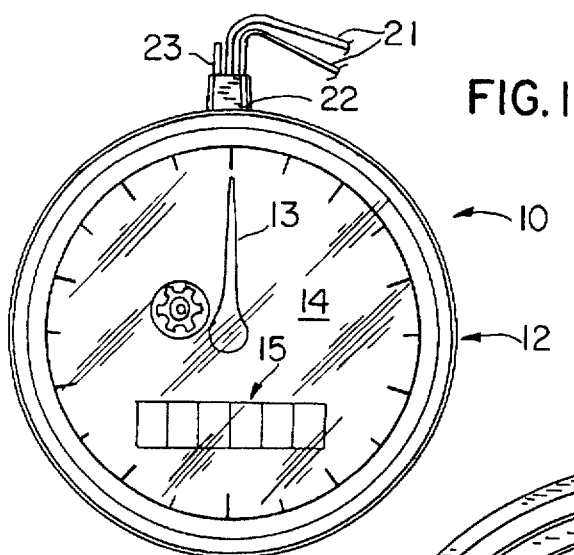
FIG. 1 is a top plan view of meter register assembly incorporating the present invention.
Figure 2:
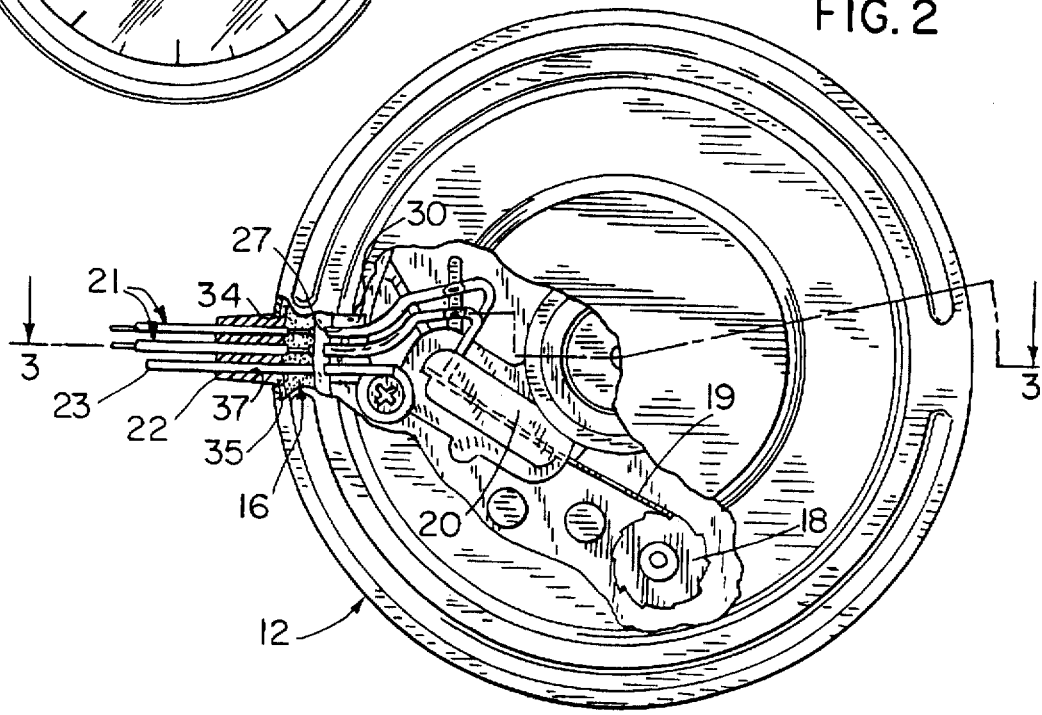
FIG. 2 is a bottom plan view of the assembly of FIG. 1 with parts broken away.
Figure 3:
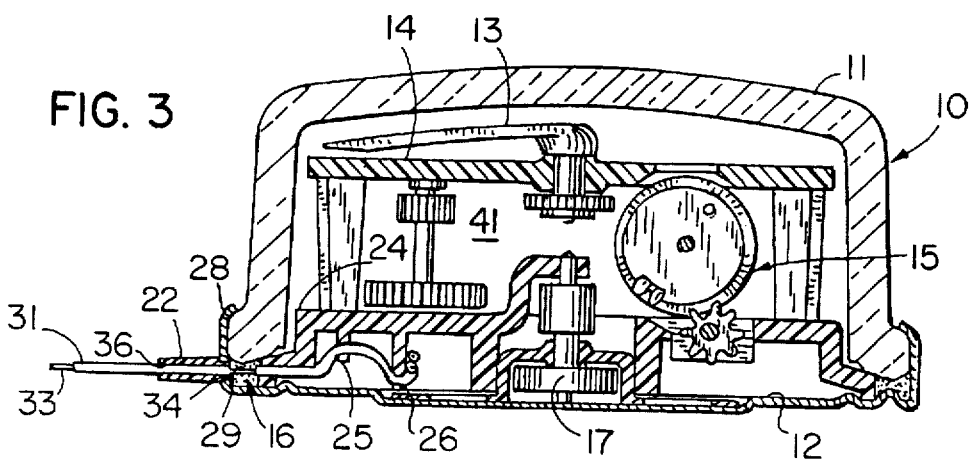
FIG. 3 is an elevational sectional view of the assembly taken in the plane indicated by line 3—3 in FIG. 2.

Referring to FIGS. 1–3, the invention is incorporated in a meter register assembly 10 in which insulated wires 21 enter through the base 12. The register assembly 10 is shown without a plastic protective shell which is added to complete the meter register unit. The assembly 10 includes a glass dome or crystal 11. The base 12 is provided by a thin metal plate of brass that has been formed and shaped to add certain features. The crystal 11 is joined to the base 12 by a sealing material 16, which may be one of many suitable epoxy adhesives known in the art.

Looking through the crystal 11 in FIG. 1, there is seen a dial indicator hand 13, a dial face 14 and an odometer assembly 15. As seen in FIG. 3, the dial face 14 is part of a plastic chassis that is supported by a chassis base 24 of plastic material that is formed in a complex configuration.

As further seen in FIG. 3, the register unit 10 has a magnetic coupler 17 that is rotated by magnetic forces controlled from below by a water turbine unit (not shown). The magnetic coupler 17 is mechanically connected through a gear train (not shown) to drive the odometer 15 and the dial hand 14 to display accumulated consumption. The magnetic coupler 17 is also mechanically connected to drive a cam 18 seen in FIG. 2. When the cam 18 is advanced by one position, a leaf spring 19 cantilevered at one end has a free end that moves laterally and then moves back to its original position. This movement or flexing of the leaf spring 19 generates a pulse from the pulse transmitter unit 20 as explained in Strobel et al., U.S. Pat. No. 4,868,566, entitled "Flexible Piezoelectric Switch Activated Metering Pulse Generators."

The pulse transmitter 20 is connected by two wires 21 to other equipment for counting and reporting accumulated pulses. The wires 21 are marked for polarity. The wires 21 are typically conductors 33 sheathed in polyvinyl chloride (PVC) insulation material 31. The conductors 33 are solid wire conductors.

A plug 22 (FIG. 3), in the form of a grommet of elastomeric material, projects through an opening 34 in a sidewall 28 of the base 12. The grommet 22 has a flange and groove portion 35 (FIG. 2) for anchoring it in the sidewall 28 and to prevent it from being pulled through the opening 34. The grommet 22 has three holes or passageways 36 (FIGS. 2, 3), two for the wires 21 and a third passageway 37 for receiving a copper vent tube 23. The wires 21 pass through the grommet 22 and are then received in guideways 27 (FIG. 2) formed by parallel barriers 30 on the chassis base 24. From there, the wires 21 run through supports 25, 26 (FIGS. 2, 3) on the chassis base 24, and then connect to the pulse transmitter 20 (FIG. 2).

The grommet 22, wires 21 and sealing material 16 are all installed in the assembly of the crystal 11 to the base 12. During assembly, the vent 23 (FIG. 2) prevents air pressure from increasing inside the unit 10 during assembly. Then air is evacuated through the vent tube 23, and a gas is introduced to dry the interior space 41 and prevent moisture from accumulating inside the register unit 10. This gas can be helium, or a dry nitrogen could also be used to dry the interior space 41 in the register 10. The vent tube 23 is then closed by welding, the preferred manner of closing, or by soldering or crimping the open end of the vent tube 23.

Figure 4:
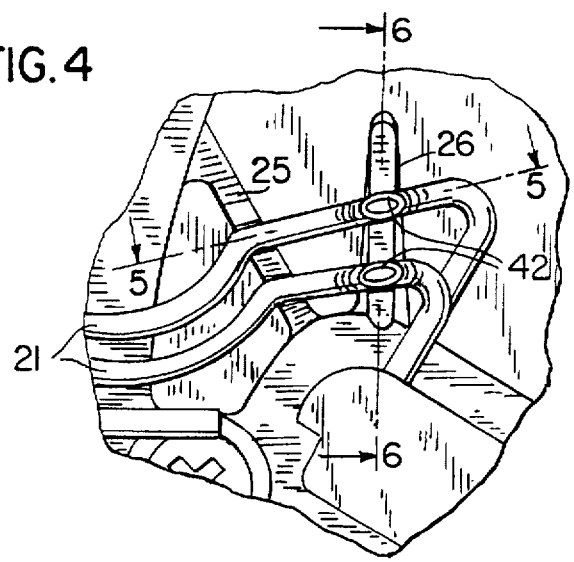
FIG. 4 is a detail view of a portion of the assembly of FIG. 2.
Figure 5:
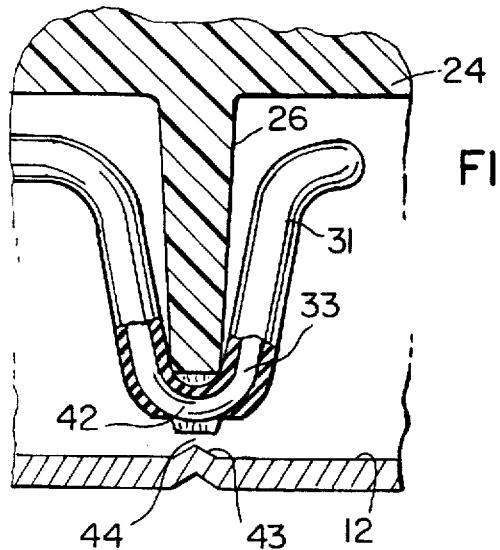
FIG. 5 is a detail sectional view taken in the plane indicated by line 5—5 in FIG. 4.
Figure 6:
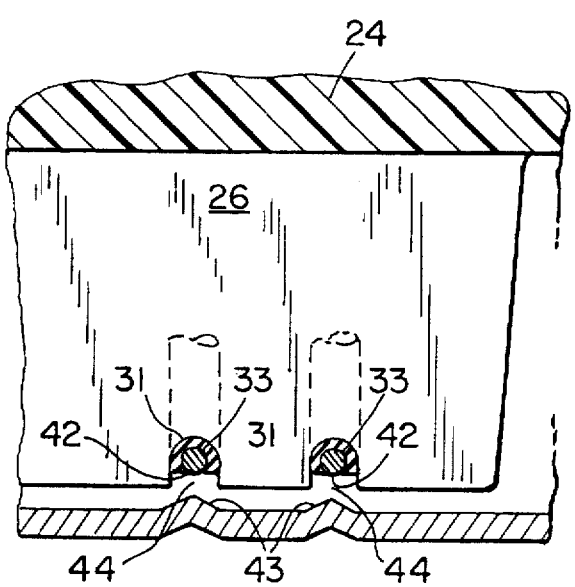
FIG. 6 is a detail sectional view taken in the plane indicated by line 6—6 in FIG. 4.

The invention provides for the stripping insulation 31 from portions of the wires 21 in region 42 (FIGS. 4-6), where the wires are held by support 26, a short distance from the copper base 12. The copper base 12 has one or more conical projections 43 which provide concentrated, high density, low inductance paths for the electrostatic charge to discharge through the copper base 12, which is grounded. The interior space 41 is preferably filled with helium, which is sufficiently conductive that it provides a discharge path from anywhere in the interior 41 to a gap 44 (FIG. 5) between conical projections 43 and stripped region 42. The gap preferably has a linear dimension in a range from 0.75 mm (0.030 inches) to 1.0 mm (0.040 inches). If an electrostatic charge is developed in the interior space 41, the invention provides for discharge through the gap 44 to the base 12, which is electrically connected to ground.

This has been a description of examples of how the invention can be carried out. Those of ordinary skill in the art will recognize that various details may be modified in arriving at other detailed embodiments, and these embodiments will come within the scope of the invention.

Therefore, to apprise the public of the scope of the invention and the embodiments covered by the invention, the following claims are made.

We claim:

1. In an instrument housing having a top and a base assembled together, an assembly for electrostatic discharge comprising:

a chassis inside the instrument housing with a support for holding at least a pair of wires;

said a pair of wires having insulated portions and having bare portions where the pair of wires is mounted to the support;

wherein the base is formed of a conductive material and wherein the base has at least one projection extending towards a corresponding one of the bare portions;

wherein the instrument contains a volume of a gas for conducting electrostatic charge;

such that an electrostatic discharge gap is provided between the projection and one of the bare portions of the wires through which said charge may be conducted to the base of conductive material for discharge from the interior of the instrument.

2. The assembly of claim 1, wherein the projection is cone-shaped.

3. The assembly of claim 1, wherein the support is a support that depends from a portion of the chassis that is located above the base.

4. The assembly of claim 1, wherein the gas is helium.

5. The assembly of claim 1, wherein the pair of wires include solid condutors and wherein the insulated portions are insulated with a polyvinyl chloride material.

6. The assembly of claim 1, wherein instrument housing is for a utility metering device.

7. The assembly of claim 1, wherein the assembly has a second support for supporting the pair of wires in addition to the support holding the bare portions of the wires next to the electrostatic discharge gap.

8. The assembly of claim 1, wherein the gap provides separation between the projection and the one of the bare portions of the wires in range from about 0.75 mm (0.030 ) to about 1.0 mm (0.040 inches).

9. The assembly of claim 1, wherein at least one projection comprises two projections, each projection being conical and each projection extending toward a respective one of the bare portions of the wires.

10. A sealed instrument comprising:

a housing having a top and a base;

a chassis inside the instrument with a support for holding at least a pair of wires;

said pair of wires having having insulated portions and having bare portions where the pair of wires is mounted to the support;

wherein the base is formed of a conductive material and wherein the base has at least one projection extending upward towards the bare portions;

wherein the strument contains a volume of a gas for conducting electrostatic charge;

such that an electrostatic discharge gap is provided between the projection and one of the bare portions of the wires through which said charge may be conducted to the base of conductive material for discharge from the interior of the instrument.

11. The sealed instrument of claim 10, wherein the projection is conical in shape.

12. The sealed instrument of claim 10, wherein the support is a support that depends from a portion of the chassis that is located above the base.

13. The sealed instrument of claim 10, wherein the gas is helium.

14. The sealed instrument of claim 10, wherein the pair of wires include solid conductors and wherein the insulated portions are insulated with a polyvinyl chloride material.

15. The sealed instrument of claim 10, wherein the instrument housing is for a utility metering device.

16. The sealed instrument of claim 10, wherein the assembly has a second support for supporting the pair of wires in addition to the support holding the bare portions of the wires next to the electrostatic discharge gap.

17. The sealed instrument of claim 10, wherein the gap provides separation between the projection and one of the bare portions of the wires in a range from about 0.75 mm (0.030 inches) to about 1.0 mm (0.040 inches).

18. The sealed instrument of claim 10, wherein the at least one projection comprises two projections, each projection being conical and each projection extending toward a respective one of the bare portions of the wires.

\* \* \* \* \*

UNITED STATES PATENT AND TRADEMARK OFFICE
CERTIFICATE OF CORRECTION

Patent No.   : 5,744,714

Dated        : April 28, 1998

Inventor(s)  : H. Paul Walding, Jr., et al.

It is certified that error appears in the above-identified patent and that said Letters Patent is hereby corrected as shown below:

Column 3, line 52, "said a pair" should be --said pair--.

Column 4, line 16, "(0.030)" should be --(0.030 inches)--.

Column 4, line 26, "having having" should be --having--.

Signed and Sealed this

Tenth Day of November 1998

BRUCE LEHMAN

Attest:

Attesting Officer

Commissioner of Patents and Trademarks